United States Patent
Truttmann et al.

(10) Patent No.: US 9,085,029 B2
(45) Date of Patent: Jul. 21, 2015

(54) MONITORING DEVICE FOR A SLIDING CLOSURE, A CASTING TUBE CHANGER OR THE LIKE ON A METALLURGICAL VESSEL

(75) Inventors: Urs Truttmann, Hunenberg See (CH); Ivo Infanger, Hochdorf (CH)

(73) Assignee: Stopinc Aktiengesellschaft, Hunenberg (CH)

( * ) Notice: Subject to any disclaimer, the term of this patent is extended or adjusted under 35 U.S.C. 154(b) by 424 days.

(21) Appl. No.: 13/577,936

(22) PCT Filed: Feb. 17, 2011

(86) PCT No.: PCT/EP2011/000751
§ 371 (c)(1),
(2), (4) Date: Oct. 18, 2012

(87) PCT Pub. No.: WO2011/101138
PCT Pub. Date: Aug. 25, 2011

(65) Prior Publication Data
US 2013/0194748 A1    Aug. 1, 2013

(30) Foreign Application Priority Data

Feb. 19, 2010 (CH) .................................. 00209/10

(51) Int. Cl.
| | |
|---|---|
| H05K 5/00 | (2006.01) |
| H05K 7/00 | (2006.01) |
| G06F 1/16 | (2006.01) |
| B22D 45/00 | (2006.01) |
| B22D 41/22 | (2006.01) |
| B22D 41/46 | (2006.01) |
| C21C 5/46 | (2006.01) |
| F27B 14/20 | (2006.01) |
| F27D 3/14 | (2006.01) |
| F27D 19/00 | (2006.01) |
| F27D 21/00 | (2006.01) |
| H05K 7/20 | (2006.01) |
| C21C 5/52 | (2006.01) |

(52) U.S. Cl.
CPC ................ *B22D 45/00* (2013.01); *B22D 41/22* (2013.01); *B22D 41/46* (2013.01); *C21C 5/4673* (2013.01); *F27B 14/20* (2013.01); *F27D 3/14* (2013.01); *F27D 19/00* (2013.01); *F27D 21/00* (2013.01); *H05K 5/00* (2013.01); *H05K 7/20009* (2013.01); *H05K 7/20136* (2013.01); *C21C 2005/5288* (2013.01)

(58) Field of Classification Search
CPC . H05K 5/00; H05K 7/20009; H05K 7/20136; F27D 3/14; F27B 14/20; C21C 5/4673; B22D 41/22; B22D 41/46
USPC ................ 361/679.01, 679.48, 694, 679.41; 222/592, 594, 597
See application file for complete search history.

(56) References Cited

U.S. PATENT DOCUMENTS 4,616,694 A * 10/1986 Hsieh ............................... 165/47
6,023,402 A * 2/2000 Kaminski ...................... 361/103

(Continued)

FOREIGN PATENT DOCUMENTS

| EP | 1 260 345 A1 | 11/2002 |
|---|---|---|
| WO | 95/25255 A1 | 9/1995 |
| WO | 02/088400 A1 | 11/2002 |
| WO | 2010/025129 A1 | 3/2010 |

*Primary Examiner* — Anthony Haughton
(74) *Attorney, Agent, or Firm* — Brian Roffe

(57) ABSTRACT

Monitoring device for sliding closures, casting tube changers or the like on a foundry ladle or a similar metallurgical vessel, wherein the device has an electronics system for detecting parameters of the monitored device that are functionally important during casting. In order to ensure trouble-free functioning of the electronics system, the system is housed in a unit fastened to the foundry ladle. The unit has thermal insulation and is provided with an air cooling system which is operated with purified cooling air and can be electrically driven both by an energy source supplied by the waste heat of the foundry ladle and by an external energy source.

20 Claims, 1 Drawing Sheet

(56) References Cited

U.S. PATENT DOCUMENTS

| | | | |
|---|---|---|---|
| 6,436,337 B1 * | 8/2002 | Gross | 266/242 |
| 6,668,209 B2 * | 12/2003 | Urbanek | 700/200 |
| 7,282,171 B2 * | 10/2007 | Gross | 266/44 |
| 8,009,430 B2 * | 8/2011 | Claassen et al. | 361/724 |
| 8,385,065 B2 * | 2/2013 | Weaver et al. | 361/695 |
| 2010/0017027 A1 | 1/2010 | Truttmann | |
| 2011/0127265 A1 | 6/2011 | Steiner et al. | |
| 2011/0127302 A1 | 6/2011 | Steiner et al. | |
| 2011/0188538 A1 | 8/2011 | Melgaard | |

* cited by examiner

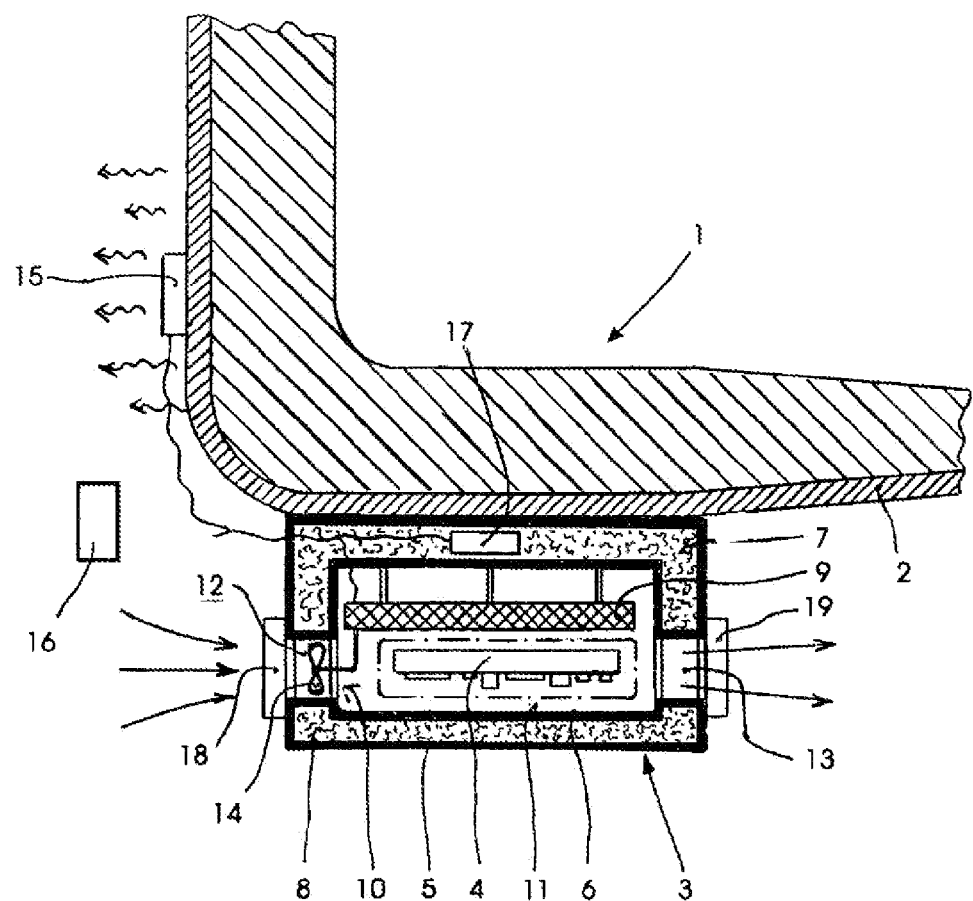

MONITORING DEVICE FOR A SLIDING CLOSURE, A CASTING TUBE CHANGER OR THE LIKE ON A METALLURGICAL VESSEL

FIELD OF THE INVENTION

The invention relates to a monitoring device for a sliding closure, a casting tube changer or the like on a metallurgical vessel, the device being provided with an electronics system for detecting the parameters of the monitored apparatus that are functionally important during casting.

BACKGROUND OF THE INVENTION

Devices of this type are used for example with foundry ladles for monitoring the function of the sliding closure disposed on the ladle spout. It is their purpose to detect the functionally important parameters of the sliding closure during casting and to indicate changes in the latter in order to prevent disruption of operations and to avoid grave operating failures. Moreover, they are also suitable for automating the operating procedure at the ladle station of the casting plant, for example by using robot-type devices, in particular also for data recording.

In such monitoring devices the electronics system is known to serve to reliably detect the measurement data supplied during the whole ladle cycle, for example by a diagnosis system of the sliding closure. These include among other things pressure and temperature values as well as wear and other geometric or drive parameters. By means of these measurement data it is established, for example, whether a change of specific apparatus parts or even of the whole apparatus is indicated.

It is a disadvantage with the known monitoring devices that their electronics system generally placed close to the casting apparatus is subjected to the prevailing rough operating conditions, in particular the dusty air or a vacuum, and the high ambient temperature during casting. This can result in faulty data and so faulty diagnoses with regard to the operating state of the sliding closure.

OBJECTS AND SUMMARY OF THE INVENTION

The object underlying the invention is to avoid these disadvantages and to provide a monitoring device of the type specified at the start, the electronics system of which is protected against disruptive influences of the environment during casting.

This object is achieved according to the invention in that the electronics system is housed in at least one separate unit that can be attached to the vessel, the sliding closure, the casting tube changer or the like, and that performs the function of protecting the electronics system.

In this way it is ensured that the electronics system can always function at an ambient temperature suitable for it and which is lower in the interior of the unit than the ambient temperature in the plant.

Moreover, the unit is largely closed off from the environment so that it can have a dust-free interior without any great effort.

With the electronics system monitoring work can be carried out on a sliding closure, a casting tube changer or the like as well as on the vessel itself without there having to be corresponding cable connections from the metallurgical vessel to a control centre. This can be particularly advantageous if the vessel, such as for example a ladle containing molten steel, is brought by a crane from the ladle position to a filling station and then on to a treatment station and consequently to the casting platform. Accordingly, any cable connections to the respective station must be made or released.

Furthermore, the invention makes provision such that the unit is provided with an active cooling system. A strong cooling effect can thus be achieved which can, moreover, be matched easily from case to case to the respective working conditions of the plant.

Within the context of a structurally simple arrangement it is advantageous if the cooling system according to the invention is formed by an air cooling system having at least one ventilator which can preferably be driven by an energy source supplied by the waste heat of the vessel. A cooling system of this type is energy-saving and at the same time sufficiently robust to work under rough operating conditions.

The invention further makes provision such that the ventilator can additionally be driven by an external energy source. Its object is to even out fluctuations in the waste heat-dependent energy supply. If so required, it can also take over the whole energy supply to the ventilator.

Advantageously both energy sources generate current, the ventilator being able to be driven electrically by the current supplied by said sources.

In addition to or instead of the active cooling system, provision is made according to the invention such that the unit is provided with heat insulation.

For the purpose of the highest possible heat insulating effect the unit is designed such that it forms two insulating chambers lying one inside the other, the heat insulation being located in the outermost chamber and the electronics being housed in the innermost chamber, and being shielded here by an insulating wall with respect to the vessel.

Moreover, the invention makes provision such that the unit is provided with an air filter device. The ambient air containing dust is thus prevented from having a negative impact upon the function of the electronics system.

BRIEF DESCRIPTION OF THE DRAWINGS

In the following the invention is described using an exemplary embodiment with reference to the drawing.

FIG. 1 shows a foundry ladle with a unit according to the invention, shown in section and diagrammatically.

DETAILED DESCRIPTION OF THE INVENTION

In FIG. 1 a partial region of the foundry ladle 1 is visible, to the outer jacket 2 of which, according to the invention, is attached a separate unit 3 with the electronics system 4 in order to protect with the latter a monitoring device, otherwise not shown, for a sliding closure, a casting tube changer or a similar casting apparatus. This unit 3 is for example in the form of a thermal protection box.

This separate unit 3 has an outer housing 5 and an inner housing 6, the space 7 between both housings being provided with heat insulation 8. The electronics system 4 is accommodated in the inner housing 6 and is additionally shielded here by an insulating wall 9 with respect to the casting ladle 1.

There is disposed in the unit 3 a cooling device 10 by means of which the interior 11 of the unit is actively cooled with cooling air or some other coolant, such as for example argon gas, nitrogen or similar. For this purpose a cooling air inlet opening 12 and a waste air outlet opening 13 are advantageously provided on the side walls of the unit 3 at the level of the electronics system 4. An electrically driven ventilator 14 is disposed in the inlet opening 12. This ventilator is driven by a stored energy source 15 supplied by the waste heat of the foundry ladle 1 and which can convert the thermal energy into electrical energy for the electric drive of the ventilator.

Moreover, an external energy source 16 is provided by means of which the ventilator 14 can also be driven electrically. Both energy sources 15 and 16 are connected to an accumulator 17. In this way a uniform supply of current to the ventilator 14 is guaranteed over the entire ladle cycle.

Air filters 18, 19 are arranged on the side walls of the unit in front of the inlet and outlet openings 12, 13. They prevent impurities in the air from having a negative impact upon the function of the electronics system 4.

The cooling brought about by the ventilator 14 guarantees that the room temperature in the interior 11 of the unit does not exceed a limit value suitable for trouble-free operation of the electronics system 4. Advantageously temperature regulation could also take place in the interior 11 by the temperature being measured and being compared to an ideal value, and if there is a deviation the ventilator would be switched on or off or be provided with a higher or lower rotation speed. A constant desired temperature could thus be achieved in this unit.

Instead of the air cooling system 10, other comparable cooling systems can of course be used which also have a robust structure and can be operated with simple drive and energy supply means.

Advantageously the unit is located at an easily accessible point of the foundry ladle, close to the apparatus being monitored. The latter can be connected to the electronics system of the monitoring device with a plug or similar connection as an interface.

The electronics system includes the usual components, similarly to in a computer, namely processor/s, memory, radio device (Bluetooth etc.), interfaces, sometimes also for data exchange with at least one peripheral device (computer), this electronic data exchange serving in particular to receive and store data from this electronics system.

With these electronic monitoring functions different measurements, such as for example temperature measurements, can be taken both at the vessel itself and at the sliding closure or the like and even be evaluated in the electronics system.

Moreover, with this monitoring device an off- and/or online diagnosis of the operating state of a sliding closure or the like can be made, for example in the region of the fireproof parts, such as closure plates, or in the housing, on the drive component and/or at other points, by means of which dimensions, temperatures, pressures and/or forces are measured and then evaluated.

With this electronics system, in the evaluation the values measured as actual values can be compared with desired values or desired value ranges, and if there are any deviations outside of the tolerance limits to be specified, a signal or the like for examination or emergency closure of the sliding closure is triggered.

By means of a radio connection in this electronics system data could also be conveyed to a station and being further processed here.

The invention is sufficiently illustrated by the exemplary embodiment described above. It could however be implemented by other examples. One could therefore dispense with the insulating wall 9 in the innermost chamber 11. The active cooling system could also be a cooling coil or the like.

However, a passive cooling system could also be provided wherein for example the insulation of the unit would offer sufficient protection for the electronics system.

Such a unit could, however, not only be attached to the vessel, but also to the sliding closure, to the casting tube changer or the like. This is dependent upon the available space and temperature for the metallurgical vessel which can be a ladle, a converter, a tundish or a furnace.

The invention claimed is:

1. Monitoring device for a sliding closure, a casting tube changer or another closure device on a metallurgical vessel, comprising:
    a separate housing configured to be attached to a metallurgical vessel or to a monitored apparatus on the vessel, the monitored apparatus comprising a sliding closure, a casting tube changer or another closure device;
    an electronics system configured to detect at least one parameter of the vessel or of the monitored apparatus on the vessel that is functionally important during casting of material using the vessel and the monitored apparatus, said electronics system being housed in said housing such that said housing protects said electronics system; and
    thermal insulation arranged in said housing between said electronics system and a location at which said housing is configured to be attached to the vessel or to the monitored apparatus on the vessel.

2. Monitoring device of claim 1, wherein said electronics system is arranged in an interior of said housing, further comprising a cooling system arranged in connection said housing to cool said interior of said housing.

3. Monitoring device of claim 2, wherein said housing includes a fluid opening and said cooling system comprises at least one ventilator configured to create a flow of fluid through said fluid opening and said interior of said housing.

4. Monitoring device of claim 3, further comprising an energy source coupled to said at least one ventilator to power said at least one ventilator.

5. Monitoring device of claim 4, wherein said energy source is supplied by waste heat of the vessel.

6. Monitoring device of claim 4, wherein said energy source comprises an external energy source.

7. Monitoring device of claim 4, wherein said housing comprises an outer housing and an inner housing separated from said outer housing to define a space therebetween, further comprising an accumulator coupled to said energy source to store energy and arranged in the space between said inner housing and said outer housing.

8. Monitoring device of claim 2, further comprising a temperature regulator to regulate temperature in said interior of said housing, said temperature regulator being configured to measure temperature in said interior of said housing and compare the measured temperature with a desired temperature value, and control said cooling system to address a deviation between the measured temperature and the desired temperature value.

9. Monitoring device of claim 8, wherein said housing includes a fluid opening and said cooling system comprises at least one ventilator configured to create a flow of fluid through said fluid opening and said interior of said housing.

10. Monitoring device of claim 9, further comprising an energy source coupled to said at least one ventilator to power said at least one ventilator.

11. Monitoring device of claim 1, wherein said housing is a separate unit comprising an outer housing and an inner housing separated from said outer housing to define a space therebetween, said thermal insulation being arranged in the space between said inner housing and said outer housing, said housing being configured to be attached to the vessel or to the monitored apparatus along said outer housing.

12. Monitoring device of claim 1, wherein said interior of said housing defines a first, inner insulating chamber, said housing having two housing parts and defining a second, outer insulating chamber between said two housing parts and which is separated from said first, inner insulating chamber, said first, inner insulating chamber lying inside said second, outer insulating chamber, said thermal insulation being arranged in said second, outer insulating chamber, said electronics system being arranged in said first, inner insulating chamber.

13. Monitoring device of claim 12, further comprising an insulating wall arranged in said first, inner insulating chamber and interposed between said electronics system and a side of said housing configured to be closer to the vessel, said insulating wall being spaced apart from an innermost one of said housing parts.

14. Monitoring device of claim 1, further comprising an insulating wall arranged in said interior of said housing interposed between said electronics system and the location at which said housing is configured to be attached to the vessel or to the monitored apparatus on the vessel.

15. Monitoring device of claim 1, wherein said housing includes at least one fluid opening, and said cooling system comprises at least one ventilator configured to form a flow of fluid through at least one of said at least one fluid opening, further comprising an air filter device arranged in at least one of said at least one fluid opening to filter fluid passing therethrough.

16. Monitoring device of claim 1, wherein said electronics system includes at least one processor, memory, radio frequency communications device, and at least one interface.

17. Monitoring device of claim 1, wherein said housing is configured as a separate unit to be directly attached to the vessel.

18. Monitoring device of claim 1, wherein said housing includes a fluid inlet opening and a waste fluid outlet opening, further comprising a cooling system arranged in said interior of said housing to cool said interior of said housing, said cooling system including at least one ventilator associated with said fluid inlet opening and configured to draw fluid into said interior of said housing, to flow through said interior of said housing, and then to be outlet from said interior of said housing through said waste fluid outlet opening.

19. Monitoring device of claim 18, wherein said electronics system, said fluid inlet opening and said waste fluid outlet opening are positioned at the same level relative to one another such that fluid drawn in by said at least one ventilator through said fluid inlet opening passes over or around said electronics system in its flow toward said waste fluid outlet opening.

20. Monitoring device of claim 18, wherein said at least one ventilator is arranged in said fluid inlet opening.

* * * * *